United States Patent
Yang et al.

(10) Patent No.: US 9,472,414 B2
(45) Date of Patent: Oct. 18, 2016

(54) SELF-ALIGNED MULTIPLE SPACER PATTERNING PROCESS

(71) Applicant: Taiwan Semiconductor Manufacturing Company, Ltd., Hsin-Chu (TW)

(72) Inventors: Chan Syun David Yang, Taipei (TW); Chao-Cheng Chen, Hsin-Chu (TW); Chien-Hao Chen, Chuangwei Township (TW); Chun-Hung Lee, Hsin-Chu (TW); De-Fang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/622,385

(22) Filed: Feb. 13, 2015

(65) Prior Publication Data
US 2016/0240386 A1 Aug. 18, 2016

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/308* | (2006.01) |
| *H01L 29/66* | (2006.01) |
| *H01L 21/3065* | (2006.01) |
| *H01L 21/02* | (2006.01) |
| *H01L 21/8234* | (2006.01) |

(52) U.S. Cl.
CPC ....... *H01L 21/3088* (2013.01); *H01L 21/0206* (2013.01); *H01L 21/3065* (2013.01); *H01L 21/3081* (2013.01); *H01L 21/3086* (2013.01); *H01L 21/823431* (2013.01); *H01L 29/6653* (2013.01)

(58) Field of Classification Search
CPC .................................................. H01L 21/3088
USPC ........................................... 216/46; 438/696
See application file for complete search history.

(56) References Cited

U.S. PATENT DOCUMENTS

| | | | |
|---|---|---|---|
| 8,039,179 B2 | 10/2011 | Shieh et al. | |
| 8,202,681 B2 | 6/2012 | Lin et al. | |
| 8,728,332 B2 | 5/2014 | Lin et al. | |
| 8,822,243 B2 | 9/2014 | Yan et al. | |
| 2006/0091468 A1 | 5/2006 | Liaw | |
| 2007/0026684 A1* | 2/2007 | Parascandola | H01L 21/0337 438/733 |
| 2011/0281208 A1 | 11/2011 | Lin et al. | |
| 2012/0278776 A1 | 11/2012 | Lei et al. | |
| 2013/0295769 A1 | 11/2013 | Lin et al. | |
| 2013/0320451 A1 | 12/2013 | Liu et al. | |

(Continued)

*Primary Examiner* — Roberts Culbert
(74) *Attorney, Agent, or Firm* — Slater Matsil, LLP

(57) ABSTRACT

Embodiments of the present disclosure are a method of forming a semiconductor device and methods of patterning a semiconductor device. An embodiment is a method of forming a semiconductor device, the method including pattering a mandrel layer disposed over a semiconductor device layer to form a mandrel, forming a first set of spacers on sidewalls of the mandrel using a first material, selectively removing the mandrel disposed between the first set of spacers. The method further includes after removing the mandrel, using the first set of spacers as a first set of mandrels, forming a second set of spacers on sidewalls of the first set of mandrels using a second material, the second material having a different etch selectivity from the etch selectivity of the first material, the second set of spacers have substantially flat top surfaces, and selectively removing the first set of mandrels disposed between the second set of spacers.

20 Claims, 12 Drawing Sheets

(56) References Cited

U.S. PATENT DOCUMENTS

| | | |
|---|---|---|
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |

* cited by examiner

SELF-ALIGNED MULTIPLE SPACER PATTERNING PROCESS

BACKGROUND

With the increasing down-scaling of semiconductor devices, various processing techniques, such as, photolithography are adapted to allow for the manufacture of devices with increasingly smaller dimensions. However, as semiconductor processes require smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
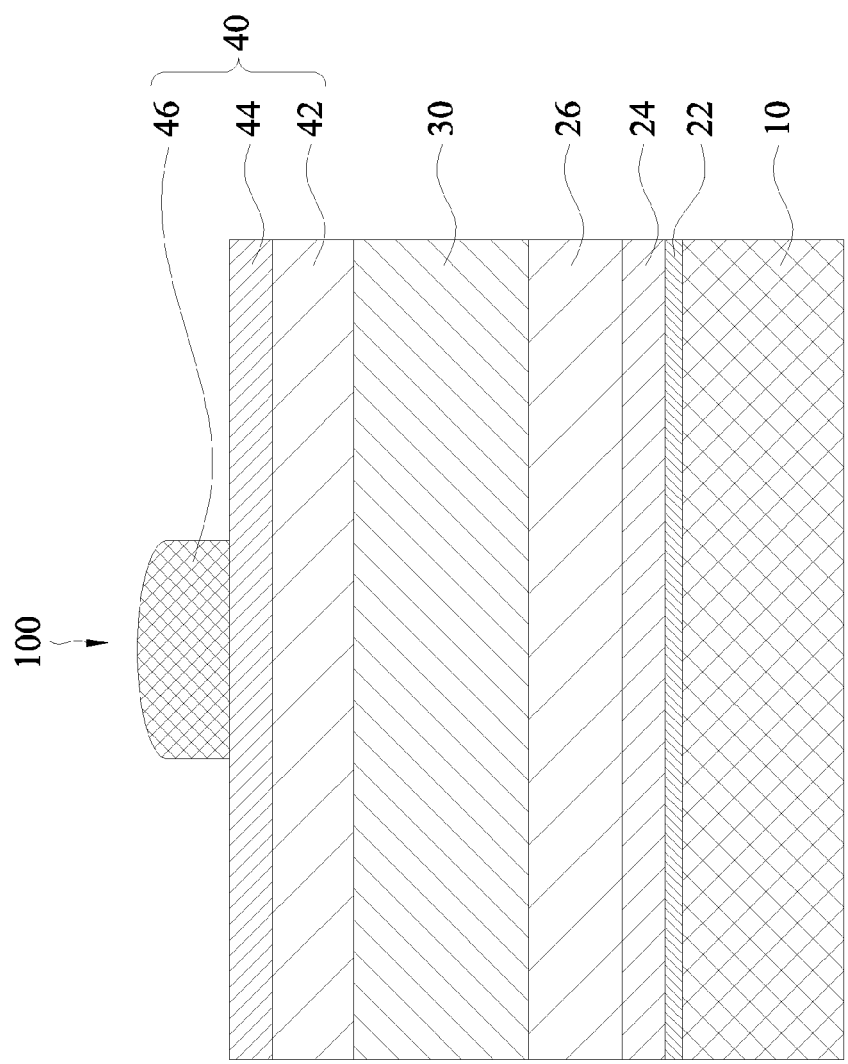
FIGS. 1 to 11 are cross-sectional views of intermediate stages in the patterning of a semiconductor device in accordance with an embodiment of the present disclosure.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a method for patterning a semiconductor device layer by transferring multiple patterns to a substrate using only one mandrel layer in the film scheme. Two spacer materials with high etch selectivity are alternatively used for spacer patterning. A spacer formed during one spacer patterning process is used as a mandrel in the next spacer patterning process, in some embodiments. At least one of the patterns includes a sidewall aligned spacer conformally deposited over mandrels.

Figure 10:
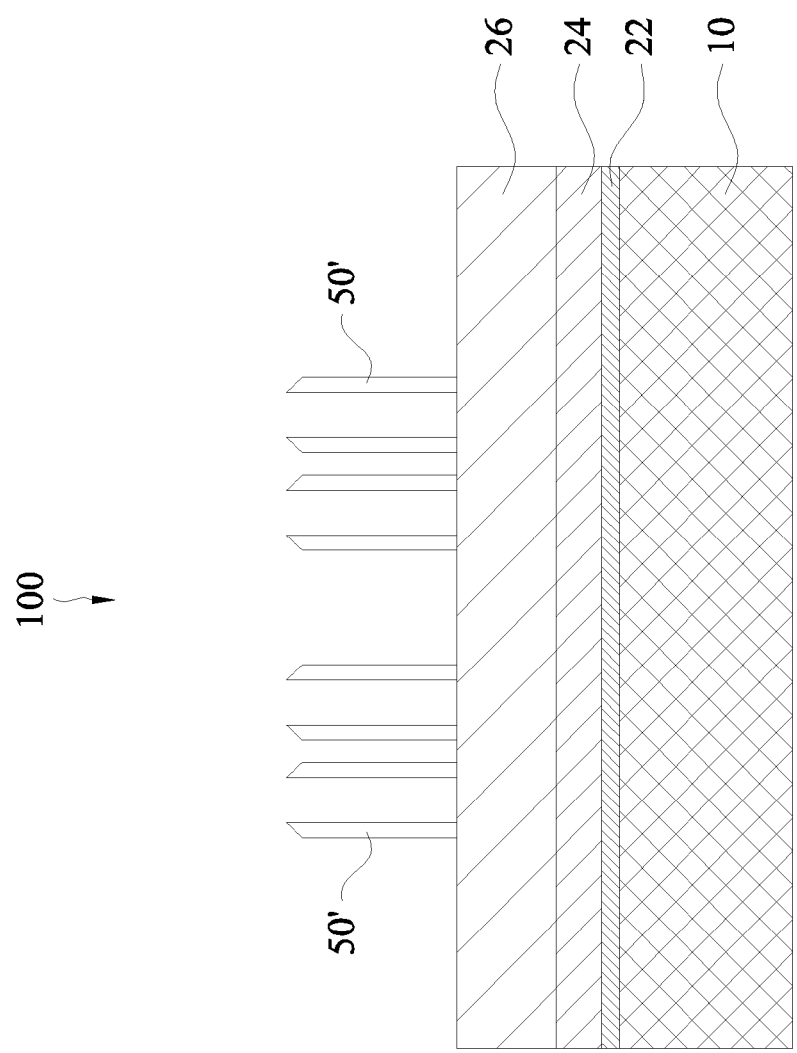
Figure 11:
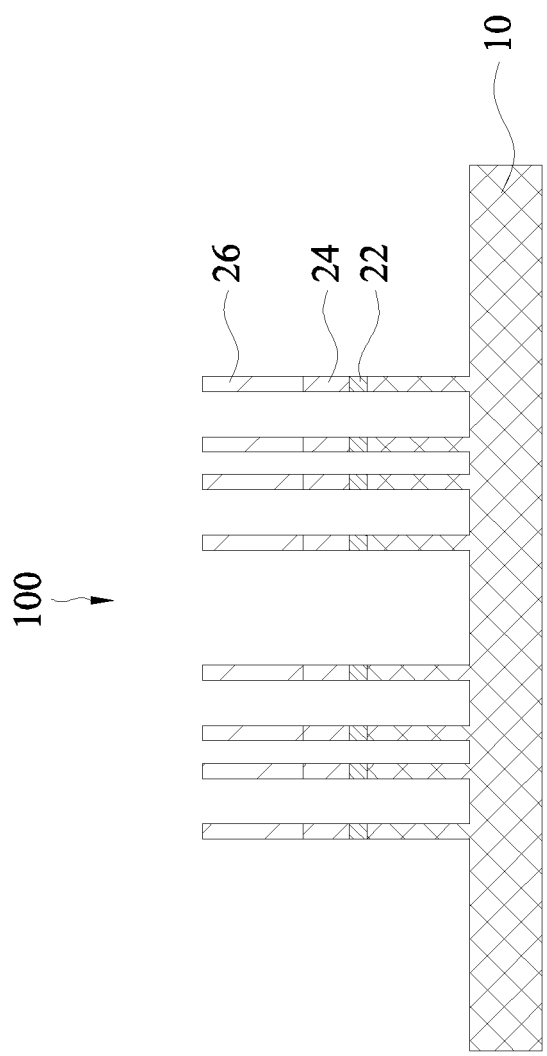
Figure 12:
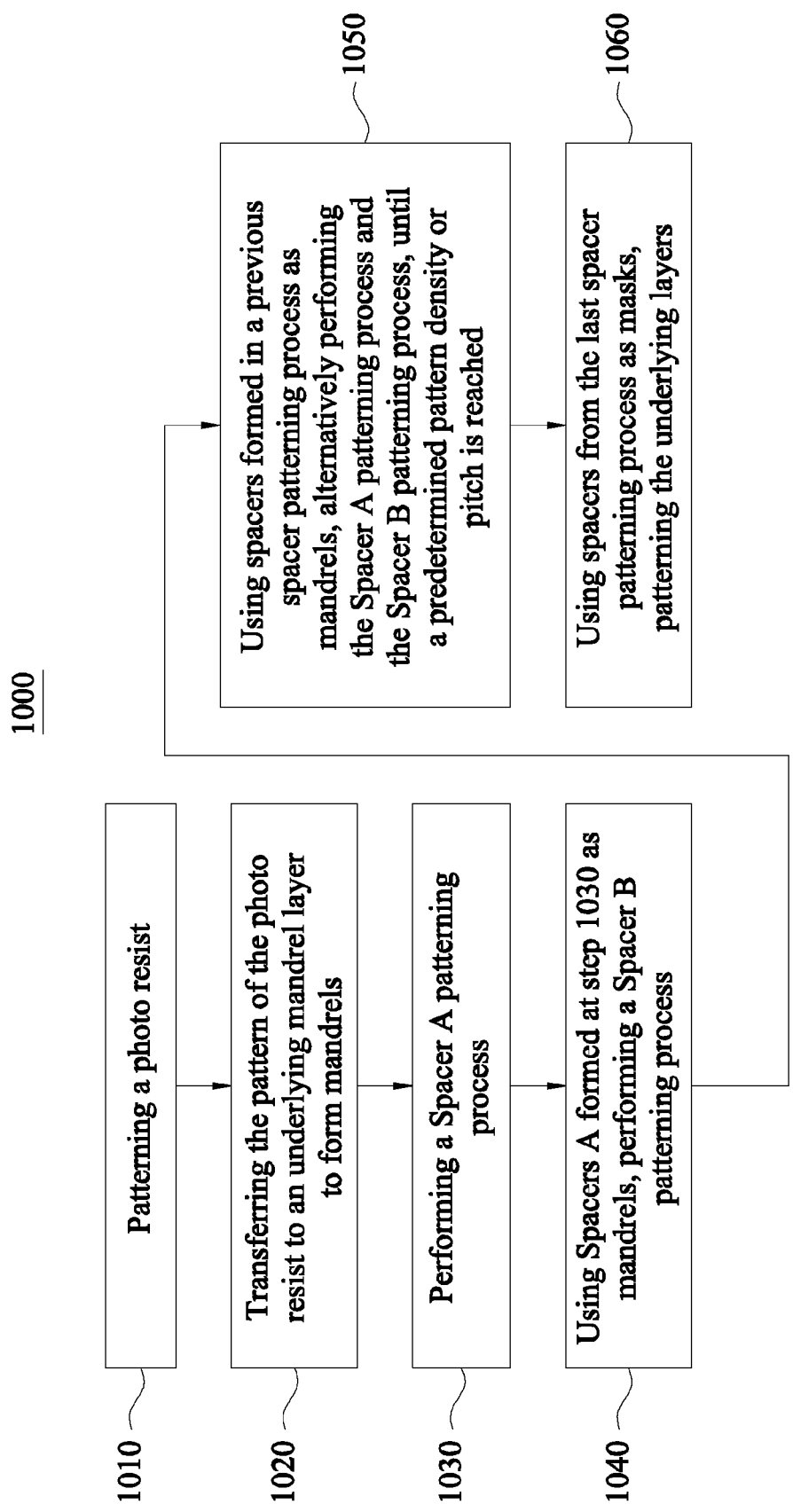
FIG. 12 illustrates a flow chart of a method for patterning a semiconductor device in accordance with various embodiments of the present disclosure.

FIGS. 1 through 11 are cross-sectional views of intermediate stages in the patterning of a semiconductor device 100 in accordance with an embodiment. FIG. 12 illustrates a flow chart of a method for patterning a semiconductor device in accordance with various embodiments of the present disclosure.

Referring to FIG. 1, the semiconductor device 100 includes a semiconductor device layer 10, hard mask layers 22, 24, and 26, a mandrel layer 30, and a tri-layer photoresist 40 over the mandrel layer 30, in some embodiments. The layers and structures shown in FIG. 1 (e.g., hard mask layers 22, 24 and 26, and tri-layer photoresist 40) illustrate one embodiment of the present disclosure. One of ordinary skill in the art will appreciate that other suitable structures comprising different number of layers and materials are possible and are fully intended to be included within the scope of the present disclosure. The semiconductor device layer 10 is a layer that requires patterning. In some embodiments, the semiconductor device layer 10 is a metallic layer to be used for metal lines and is made of copper, aluminum, the like, or a combination thereof. In other embodiments, the semiconductor device layer 10 is a dielectric layer, such as a low-k dielectric layer, a polymer layer, or the like. In yet other embodiments, the semiconductor device layer 10 is a substrate and is made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. The semiconductor device layer 10 may also be referred to as substrate 10 hereinafter, with the understanding that substrate 10 may comprise any of the embodiments for semiconductor device layer 10 described above.

Substrate 10 may include active and passive devices (not shown). As one of ordinary skill in the art will recognize, a wide variety of devices such as transistors, capacitors, resistors, combinations of these, and the like may be used to generate the structural and functional requirements of the design for the semiconductor device 100. The active and passive devices may be formed using any suitable methods.

Hard mask layer 22, 24, and 26 may be formed over substrate 10 consecutively, as illustrated in FIG. 1. In some embodiments, hard mask layer 22 comprises an oxide, such as silicon oxide which may also act as an adhesion layer, although other suitable materials may also be used. In other embodiments, the hard mask layer 22 may be an anti-reflective coating (ARC) 22. The ARC 22 prevents radiation in subsequent photolithographic processes from reflecting off layers below and interfering with the exposure process. Such interference can increase the critical dimension of the photolithography process. Sometimes the ARC 22 is referred to as an anti-reflective layer (ARL) 22. In some embodiments, the ARC 22 is a nitrogen-free ARC (NFARC) 22 and is made of a silicon-rich oxide (SRO), silicon oxycarbide, the like, or a combination thereof. In some embodiments, the ARC 22 is formed by chemical vapor deposition (CVD), plasma enhanced CVD (PECVD), the like, or a combination thereof.

The hard mask layers 24 and 26 are formed over the hard mask layer 22. In an embodiment, the hard mask layer 24 is a metal hard mask layer and the hard mask layer 26 is a dielectric hard mask layer. In subsequent processing steps, a pattern is transferred onto the hard mask layer 24 using various photolithography and etching techniques. The hard mask layer 24 may then be used as a patterning mask for etching the underlying hard mask layer 22 and substrate 10. The hard mask layer 24 may be a masking material such as silicon nitride, titanium nitride, titanium oxide, the like, or a combination thereof. The hard mask layer 24 may be formed using a process such as CVD, physical vapor deposition (PVD), atomic layer deposition (ALD), the like, or a combination thereof. In an embodiment, the hard mask layer 24 is formed to have a thickness from about 100 Angstroms to about 500 Angstroms.

The hard mask layer 26 may be deposited over the hard mask layer 24. The hard mask layer 26 may be used as a masking pattern for the hard mask layer 24. In subsequent processing steps, the hard mask layer 26 is patterned by multiple patterns (see FIG. 10) which may then be transferred to the hard mask layer 26. The hard mask layer 26 may be a masking material such as silicon oxide, tetraethyl orthosilicate (TEOS), $SiO_xC_y$, the like, or a combination thereof. The hard mask layer 26 may be formed using a process such as CVD, ALD, the like, or a combination thereof. In an embodiment, the hard mask layer 26 is formed to have a thickness from about 100 Angstroms to about 1000 Angstroms.

A mandrel layer 30 is formed over the hard mask layer 26. The mandrel layer 30 may be used to form mandrels 30' (see FIG. 2). The mandrel layer 30 may be a masking material such as polysilicon, amorphous silicon, amorphous carbon, a metal film such as $AlO_xN_y$, the like, or a combination thereof or any other material that may be patterned and selectively removed. The mandrel layer 30 may be formed using a process such as CVD, ALD, the like, or a combination thereof. In an embodiment, the mandrel layer 30 is formed to have a thickness from about 90 nanometers to about 110 nanometers, such as about 100 nanometers.

The tri-layer photoresist 40 is formed over the mandrel layer 30. The tri-layer photoresist 40 includes a top photoresist layer 46, a middle layer 44, and a bottom layer 42. As the limits of photolithography processes are reached by advanced semiconductor manufacturing processes, the need for thinner top photoresist layers has arisen to achieve smaller process windows. However, thin top photoresist layers may not be sufficiently robust to support the etching of target layers (e.g., the mandrel layer 30). The tri-layer photoresist provides a relatively thin top photoresist layer 46. The middle layer 44 may include anti-reflective materials (e.g., a backside anti-reflective coating (BARC) layer) to aid the exposure and focus of the top photoresist layer 46's processing. By having the middle layer 44, the thin top photoresist layer 46 is only used to pattern the middle layer 44. The bottom layer 42 may include a hard mask material such as a nitride (e.g., SiON). The middle layer 44 is used to pattern the bottom layer 42. In some embodiments, the middle layer 44 has a high etch selectivity to the bottom layer 42, and, in some embodiments, the bottom layer 42 is more than ten times thicker than the middle layer 44. Thus, the tri-layer photoresist 40 allows for the robust patterning of underlying layers (e.g., the mandrel layer 30) while still providing a relatively thin top photoresist layer 46.

The top photoresist layer 46 may be patterned using any suitable photolithography technique. For example, a photomask (not shown) may be disposed over the top photoresist layer 46, which may then be exposed to a radiation beam which may be ultraviolet (UV) or an excimer laser such as a 248 nm beam from a Krypton Fluoride (KrF) excimer laser, or a 193 nm beam from an Argon Fluoride (ArF) excimer laser. Exposure of the top photoresist layer 46 may be performed using an immersion lithography system to increase resolution and decrease the minimum achievable pitch. A bake or cure operation may be performed to harden the top photoresist layer 46, and a developer may be used to remove either the exposed or unexposed portions of the top photoresist layer 46 depending on whether a positive or negative resist is used. Thus, a pattern such as the pattern illustrated in FIG. 1 is formed in the top photoresist layer 46.

Figure 2:
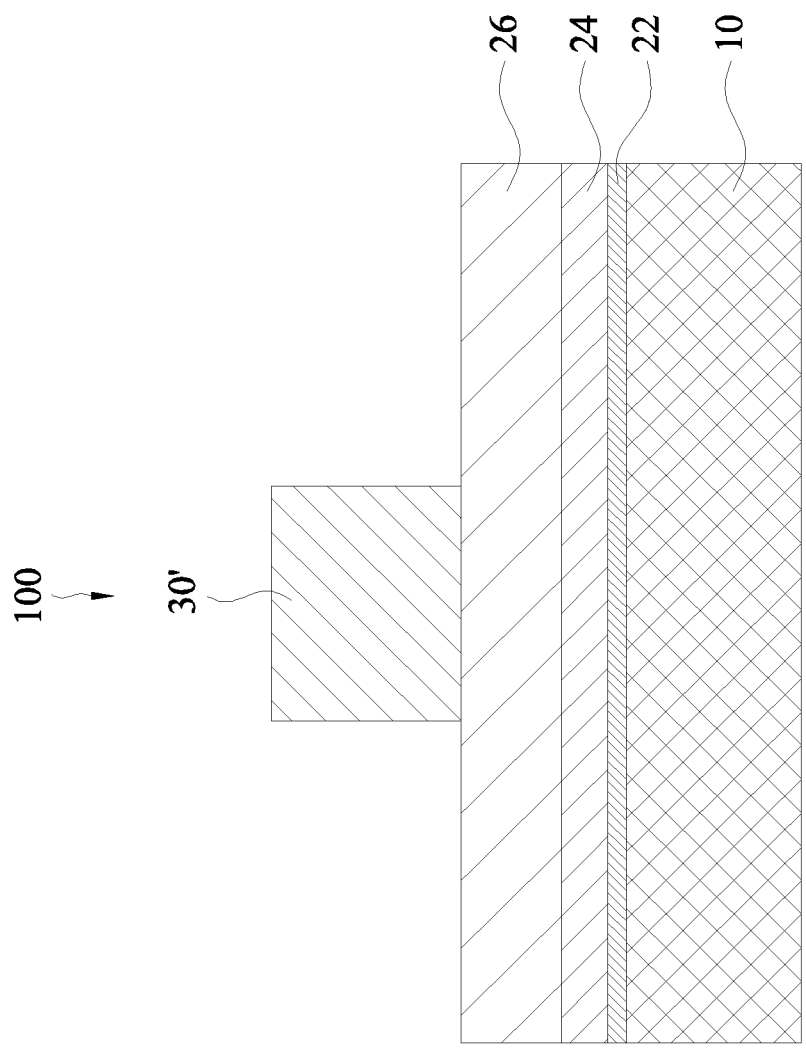

FIG. 2 illustrates the resulting structure after the mandrel layer 30 has been patterned forming mandrel 30'. After developing and patterning the top photoresist layer 46, the pattern is transferred to the middle and bottom layers 44 and 42, respectively. The pattern may be transferred, for example, by one or more selective etching processes. After the selective etching processes, the top photoresist layer 46 and the middle layer 44 may be removed by, for example, a trimming process such as an anisotropic plasma etch process. In some embodiments, portions of the bottom layer 42 are also removed during the trimming process to achieve a more stable aspect ratio for subsequent etching steps. In an embodiment, the mandrel layer 30 is etched using the bottom layer 42 as a patterning mask forming the mandrels 30'. In this embodiment, the remaining portions of the bottom layer 42 are removed by, for example, a wet clean process. In another embodiment, the trimming process is omitted, and the mandrel layer 30 is patterned using all three of three layers (46, 44, and 42) of the tri-layer photoresist 40. In some embodiments, the mandrel layer 30 is patterned by a dry etch process with etch process gases including $O_2$, $Cl_2$, HBr, He, $NF_3$, the like, or a combination thereof. FIG. 2 shows only one mandrel 30' for ease of illustration, it is to be understood that two or more mandrels 30' may be formed, depending on the design of the semiconductor device 100.

Figure 3:
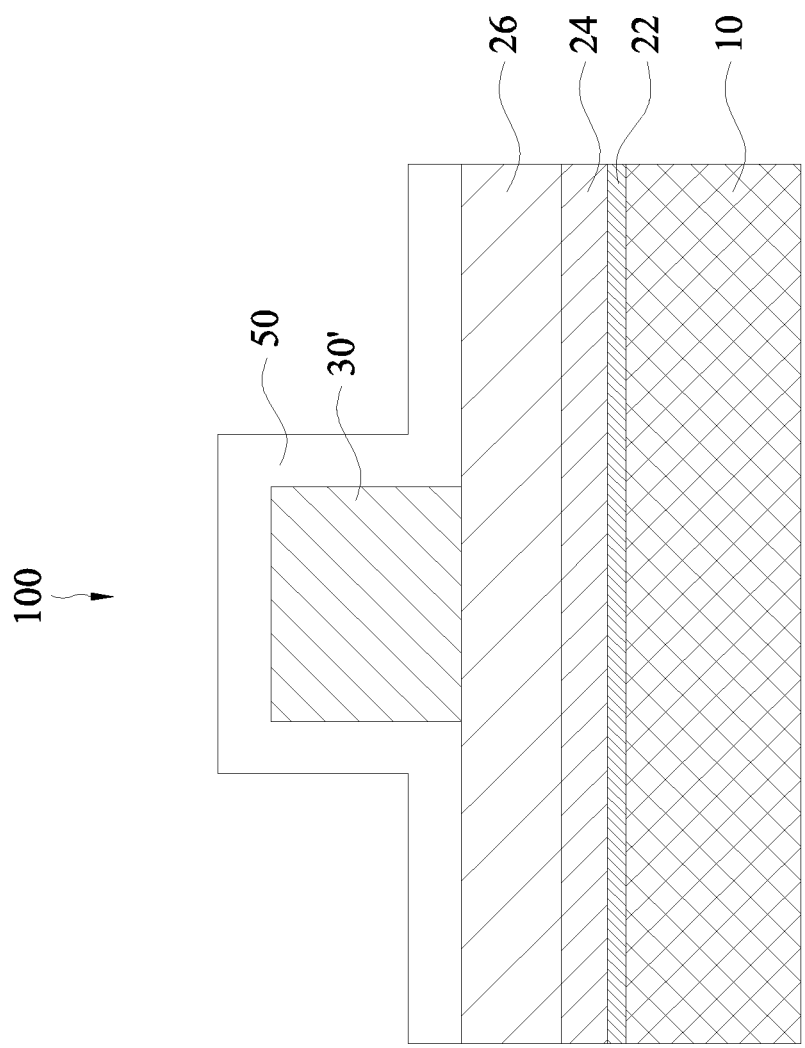

After the mandrels 30' are formed, a spacer layer 50 is formed over the mandrels 30' and the hard mask layer 26, as illustrated in FIG. 3. In an embodiment, the spacer layer 50 is conformally deposited over the mandrels 30' and the hard mask layer 26 such that the thickness of the spacer layer on the top surface of the hard mask layer 26 and the sidewalls of the mandrels 30' is substantially a same thickness. In some embodiments, the spacer layer 50 is made of SiO, SiN, SiON, SiC, SiCN, SiOCN, the like, or a combination thereof. The materials used above for spacer layer 50 are referred to as Material A hereinafter, and a spacer comprising Material A may accordingly be referred to as Spacer A hereinafter. Material A is selected to have a high etch selectivity to the hard mask layer 26 so that subsequent etching steps may be performed on the spacer layer without attacking the hard mask layer 26. The spacer layer 50 may be deposited through a process such as ALD, CVD, PVD, the like, or a combination thereof, although any acceptable process may be utilized to form the spacer layer to a thickness in a range, for example, from about 50 Angstroms to about 250 Angstroms. Further, the thickness of the spacer layer 50 may be selected to determine the thickness of features eventually formed in substrate 10.

Figure 4:
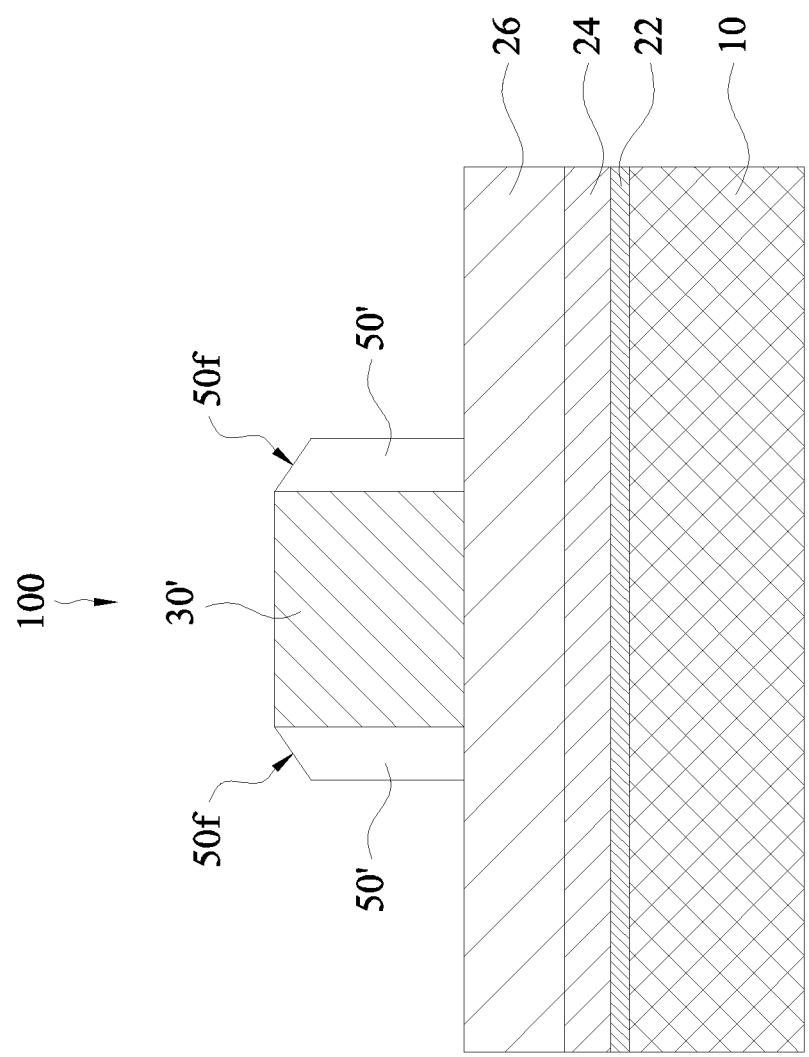

After the spacer layer 50 is formed over the mandrels 30', the spacer layer 50 may be etched to expose the mandrels 30' and form spacers 50' (e.g., Spacers A), as illustrated in FIG. 4. The top portions of the spacer layer 50 may be anisotropically etched to expose the underlying mandrels 30' and hard mask layer 26 to form the spacers 50'. The spacers 50' are formed along the sidewalls of the mandrels 30'. The spacers 50' may have slanted top surfaces 50f, or facets 50f, due to the etching process used to form the spacers 50'. In an embodiment, a two-step Spacer A plasma etching process is performed to form spacers 50'. The first step of the Spacer A plasma etching process anisotropically etches the spacer layer 50 at top surfaces of mandrels 30' and hard mask layer 26 to obtain a straight profile for spacers 50'. A second step of the Spacer A plasma etching process removes residues from the first step of the Spacer A plasma etch process and controls the spacer profile. In some embodiments, the first step of Spacer A plasma etch process is performed via a plasma etch at a pressure in a range from about 5 mTorr to about 50 mTorr, at a top power in a range from about 300 watts to about 1100 watts, with an etching bias in a range from about 30 volts to about 500 volts, at a temperature in a range from about 20° C. to about 60° C., with a plasma flow including from about 20 standard cubic centimeters per minute (sccm) to about 300 sccm of $CF_4$, about 5 sccm to about 50 sccm of $O_2$, about 30 sccm to about 600 sccm of $HB_r$, and about 50 sccm to about 800 sccm of $H_e$. In some embodiments, the second step of the Spacer A plasma etch process is performed via a plasma etch at a pressure in a range from about 10 mTorr to about 80 mTorr, at a top power in a range from about 300 watts to about 1100 watts, with an etching bias in a range from about 30 volts to about 400 volts, at a temperature in a range from about 20° C. to about 60° C., with a plasma flow including from about 2 sccm to about 300 sccm of $S_xCl_4$, about 50 sccm to about 400 sccm of $CH_3F$, about 60 sccm to about 600 sccm of $H_e$, and about 20 sccm to about 300 sccm of $O_2$.

Figure 5:
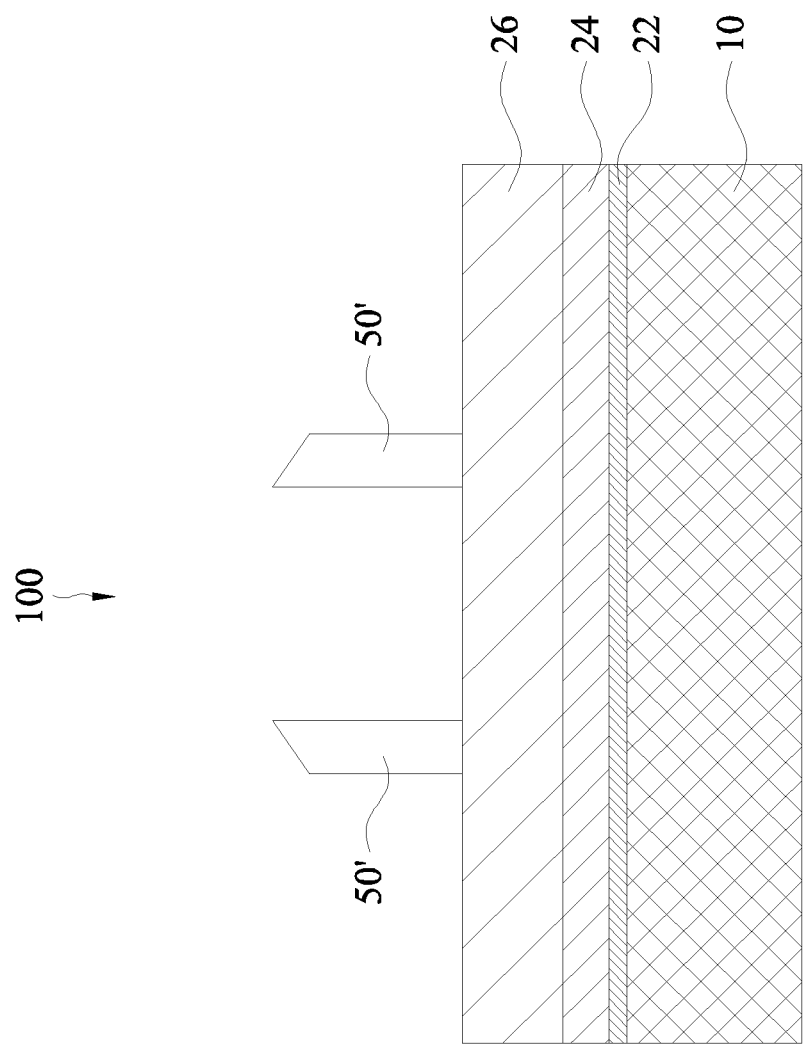

Referring to FIG. 5. After spacers 50' are formed, mandrels 30' disposed between spacers 50' (see FIG. 4) are removed by, for example, a mandrel plasma etch process, although other suitable etching process may also be used. In some embodiments, a two-step mandrel plasma etch process comprising a Main Etch followed by an Over Etch, is performed. The Main Etch of the mandrel plasma etch process removes mandrels 30'. The Over Etch of the mandrel plasma etch process removes residues from the Main Etch while keeping the profile of spacers 50'. The mandrel plasma etching process has a high etch selectivity for the mandrel material, so that mandrels 30' can be removed without attacking spacers 50' and hard mask layer 26. In some embodiments, the Main Etch is performed via a plasma etch at a pressure in a range from about 5 mTorr to about 50 mTorr, at a top power in a range from about 300 watts to about 1200 watts, with an etching bias in a range from about 30 volts to about 300 volts, at a temperature in a range from about 20° C. to about 60° C., with a plasma flow including from about 30 sccm to about 300 sccm of $Cl_2$, about 3 sccm to about 100 sccm of $O_2$, and about 30 sccm to about 600 sccm of $HB_r$. In some embodiments, the Over Etch is performed via a plasma etch at a pressure in a range from about 10 mTorr to about 100 mTorr, at a top power in a range from about 300 watts to about 1100 watts, with an etching bias in a range from about 0 volts to about 200 volts, at a temperature in a range from about 20° C. to about 60° C., with a plasma flow including from about 2 sccm to about 300 sccm of $NF_3$, about 60 sccm to about 600 sccm of $H_e$, and about 20 sccm to about 300 sccm of $Cl_2$.

The Spacer A layer (e.g., Material A layer) deposition process illustrated in FIG. 3, the Spacer A plasma etch process illustrated in FIG. 4, and the mandrel removal process illustrated in FIG. 5 are hereinafter referred to as Spacer A patterning process.

Figure 6:
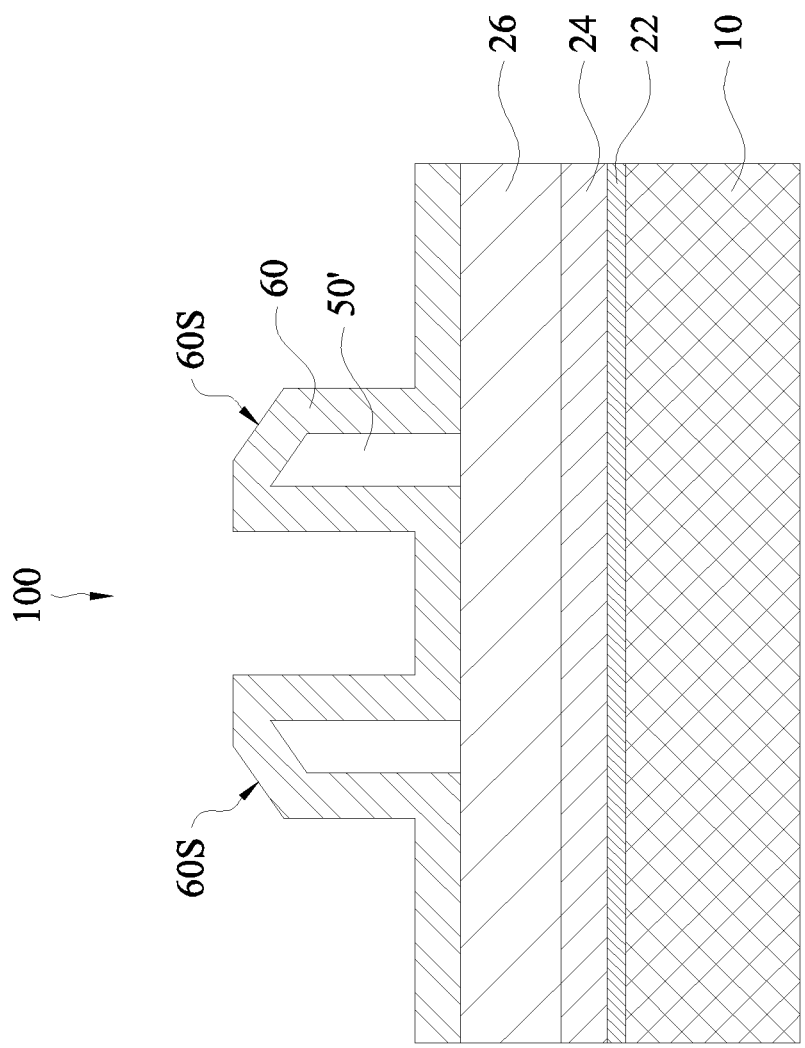

Referring to FIG. 6, after mandrels 30' are removed, Spacers A 50' (e.g., spacers 50') could be used as mandrels for a subsequent spacer layer deposition and etching process. In accordance with some embodiments, a spacer layer 60 is formed over the Spacers A 50' and the hard mask layer 26. In an embodiment, the spacer layer 60 is conformally deposited over Spacers A 50' and hard mask layer 26 such that the thickness of the spacer layer on the top surface of hard mask layer 26 and the sidewalls of Spacers A 50' is substantially a same thickness. Due to the facet at the top surface of Spacer A 50', the conformally deposited spacer layer 60 has a top shoulder 60s over each Spacer A 50'. In some embodiments, the spacer layer 60 is made of amorphous-silicon, amorphous carbon, group III-V materials, aluminum nitride, the like, or a combination thereof. The materials used above for spacer layer 60 are hereinafter referred to as Material B, and a spacer comprising Material B may be referred to as Spacer B hereinafter. Material B is selected to have a high etch selectivity to the hard mask layer 26 so that subsequent etching steps may be performed on the spacer layer without attacking the hard mask layer 26. In addition, Material B is selected to have a different etch selectivity from Material A so that Spacer A (or Spacer B) can be selectively etched way without attacking Spacer B (or Spacer A). The spacer layer 60 may be deposited through a process such as ALD, CVD, PVD, the like, or a combination thereof, although any acceptable process may be utilized to form the spacer layer. The thickness of the spacer layer 60 may be selected to determine the thickness of features eventually formed in substrate 10.

Figure 7:
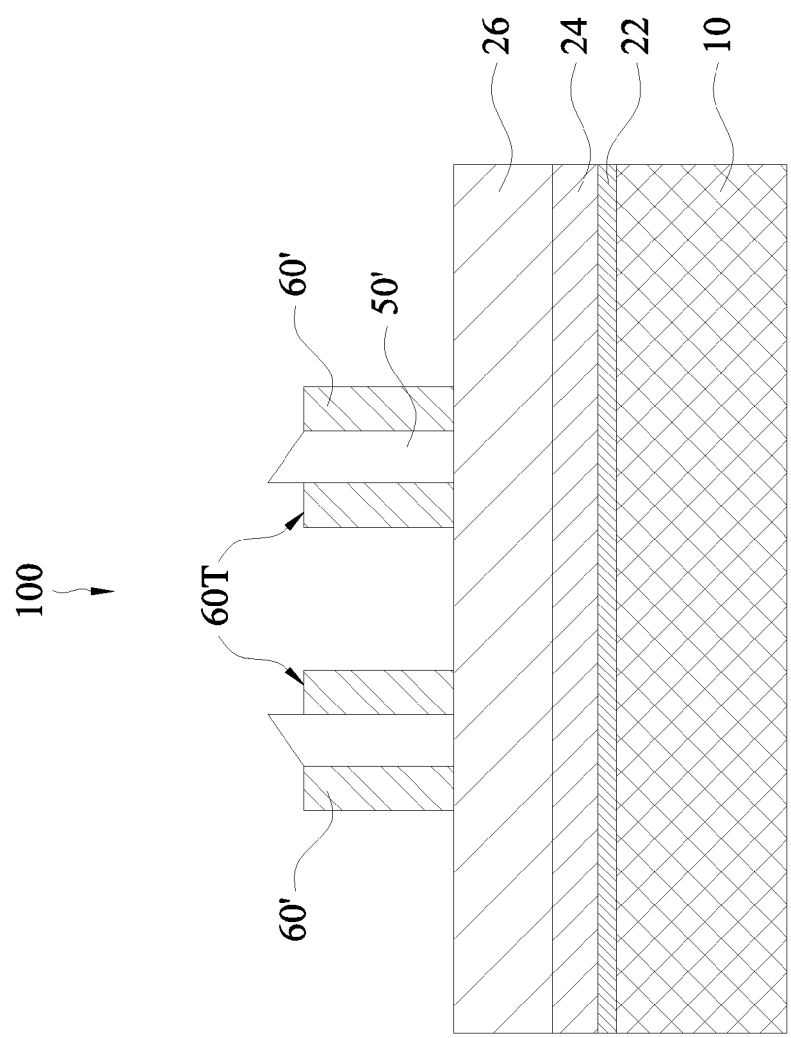

After the spacer layer 60 is formed over mandrels 50' (e.g., Spacers A 50'), the spacer layer 60 may be etched to expose mandrels 50' and form spacers 60' (e.g., Spacers B 60'), as illustrated in FIG. 7. The top portion of the spacer layer 60 may be anisotropically etched to expose the underlying mandrels 50' and hard mask layer 26 to form spacers 60'. The spacers 60' are formed along the sidewalls of mandrels 50'. A Spacer B plasma etch process is described herein to avoid faceting at top portions of spacers 60' and achieve substantially flat top surfaces 60T for spacers 60'. Faceting at top portion of spacers 60' is undesirable, since it causes spacer height loss and reduces the effective height of spacers 60'. For example, faceting produced by a conventional plasma etching process used to form spacers might cause spacer height loss as large as about 300 Angstroms. Such a large spacer height loss limits the number of spacer patterning processes that can be performed in an iterative or multiple spacer patterning process.

The Spacer B plasma etch process can achieve substantially flat top surfaces for Spacers B 60' and significantly reduces the spacer height loss to a range from about 10 Angstroms to about 20 Angstroms, in accordance with some embodiments. In an embodiment of the present disclosure, the Spacer B plasma etch process comprises a surface modification process followed by a sidewall polymer fence protection process. The surface modification process uses a plasma etch process to modify the material structure of the top surfaces of Spacers B 60' and form a hardened protection layer to prevent spacer loss. In the sidewall polymer fence protection process, polymer fences are formed along sidewalls of Spacer B 60' from by-products of plasma etch. The sidewall polymer fences help the anisotropic etch to achieve straight spacer profile and protect top portions of Spacer B 60' (e.g., shoulder 60s in FIG. 6) to reduce faceting at top portions of Spacers B 60'.

In an embodiment, the Spacer B surface modification process is performed via a plasma etch at a pressure in a range from about 2 mTorr to about 60 mTorr, at a top power in a range from about 300 watts to about 1400 watts, with an etching bias in a range from about 30 volts to about 900 volts, at a temperature in a range from about 10° C. to about 70° C., with a plasma flow including from about 10 sccm to about 800 sccm of $H_e$, about 10 sccm to about 800 sccm of $A_r$, and about 30 sccm to about 800 sccm of $O_2$. In some embodiments, the Spacer B sidewall polymer fence protection process is performed via a plasma etch at a pressure in a range from about 2 mTorr to about 60 mTorr, at a top power in a range from about 300 watts to about 1000 watts, with an etching bias in a range from about 30 volts to about 900 volts, at a temperature in a range from about 20° C. to about 60° C., with a plasma flow including from about 10 sccm to about 100 sccm of $N_2$, about 10 sccm to about 600 sccm of $A_r$, about 50 sccm to about 600 sccm of $HB_r$, about 5 sccm to about 100 sccm of $O_2$, about 5 sccm to about 100 sccm of $CF_4$, about 5 sccm to about 100 sccm of $NF_3$, and about 5 sccm to about 100 sccm of $Cl_2$.

After the Spacer B plasma etch process is finished, the by-products and polymer fences formed during the process may be removed by, for example, a Spacer B wet cleaning process. In an embodiment, the Spacer B wet cleaning process comprises an SPM cleaning followed by an APM cleaning. The SPM cleaning uses a $H_2SO_4$:$H_2O_2$ solution, also known as the Sulfuric Peroxide Mixture (SPM) solution, at a low temperature range from about 60° C. to about 90° C., in accordance with some embodiments. The APM cleaning uses a $NH_4OH$:$H_2O_2$:$H_2O$ mixture, also known as an Ammonium hydroxide-hydrogen Peroxide Mixture (APM), at room temperature, in accordance with some embodiments. As illustrated in FIG. 7, due to the highly selective etching processes used (e.g., Spacer B plasma etch process, and the Spacer B wet cleaning process), Spacers B 60' are etched without attacking Spacers A 50'. As a result, the top portion of each Spacer A 50' still has a facet.

Figure 8:
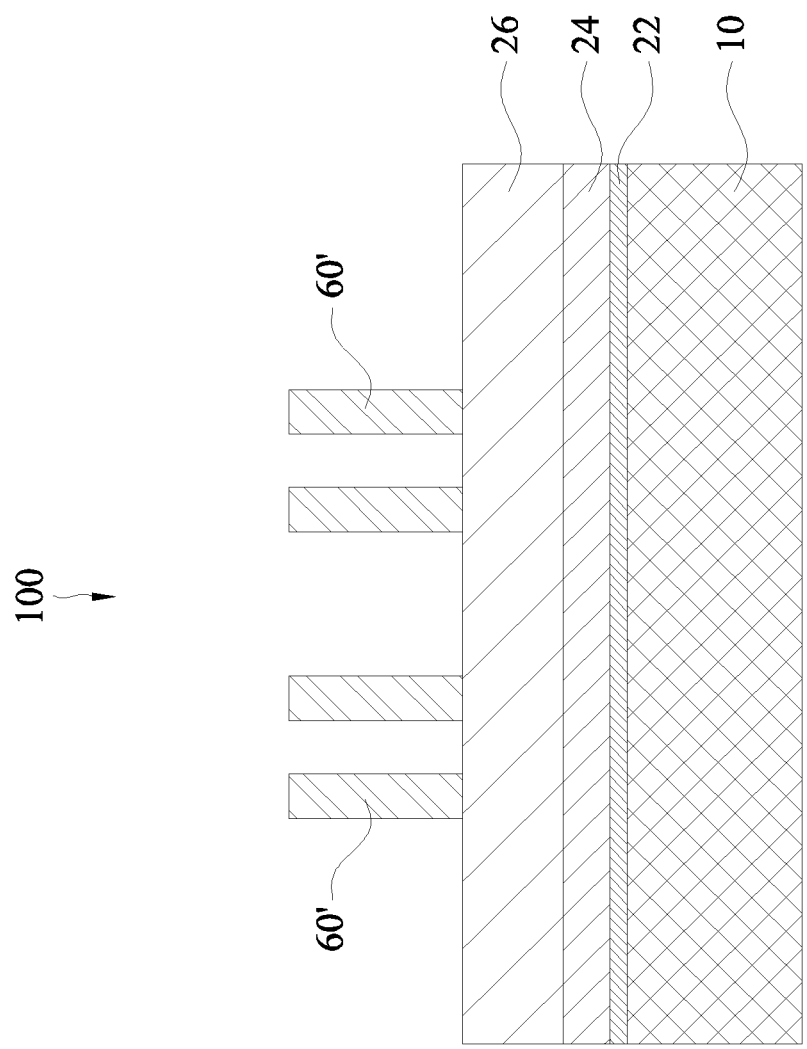

Referring to FIG. 8, mandrels 50' (e.g., Spacers A 50') disposed between Spacers B 60' are removed by, for example, a wet cleaning process, although other suitable etching process may also be used. In accordance with some embodiments, the wet cleaning process for removing Spacers A 50' comprises cleaning using a diluted HF solution, followed by cleaning using $H_3PO_4$ (Phosphoric Acid) at a high temperature range from about 150° C. to about 170° C. After removal of Spacers A 50', Spacers B 60' with flat top surfaces may serve as mandrels for a subsequent spacer layer deposition and etching process, in accordance with some embodiments.

The Spacer B layer (i.e., Material B layer) deposition process illustrated in FIG. 6, Spacer B plasma etch process and Spacer B wet cleaning process illustrated in FIG. 7, and the mandrel removal process illustrated in FIG. 8 are hereinafter referred to as Spacer B patterning process.

Depending on the design of the semiconductor device 100, the Spacer A patterning process and the Spacer B patterning process can be alternately performed multiple times, until a predetermined pattern density or pitch is reached. During the alternately performed Spacer A patterning process and Spacer B patterning process, the Spacer A patterning process uses spacers from a previous Spacer B patterning process as mandrels, and the Spacer B patterning process uses spacers from a previous Spacer A patterning process as mandrels, in some embodiments. For example, using Spacers B 60' shown in FIG. 8 as mandrels, a Spacer A patterning process may be performed following the step shown in FIG. 8, which is illustrated in FIG. 9 and FIG. 10.

Figure 9:
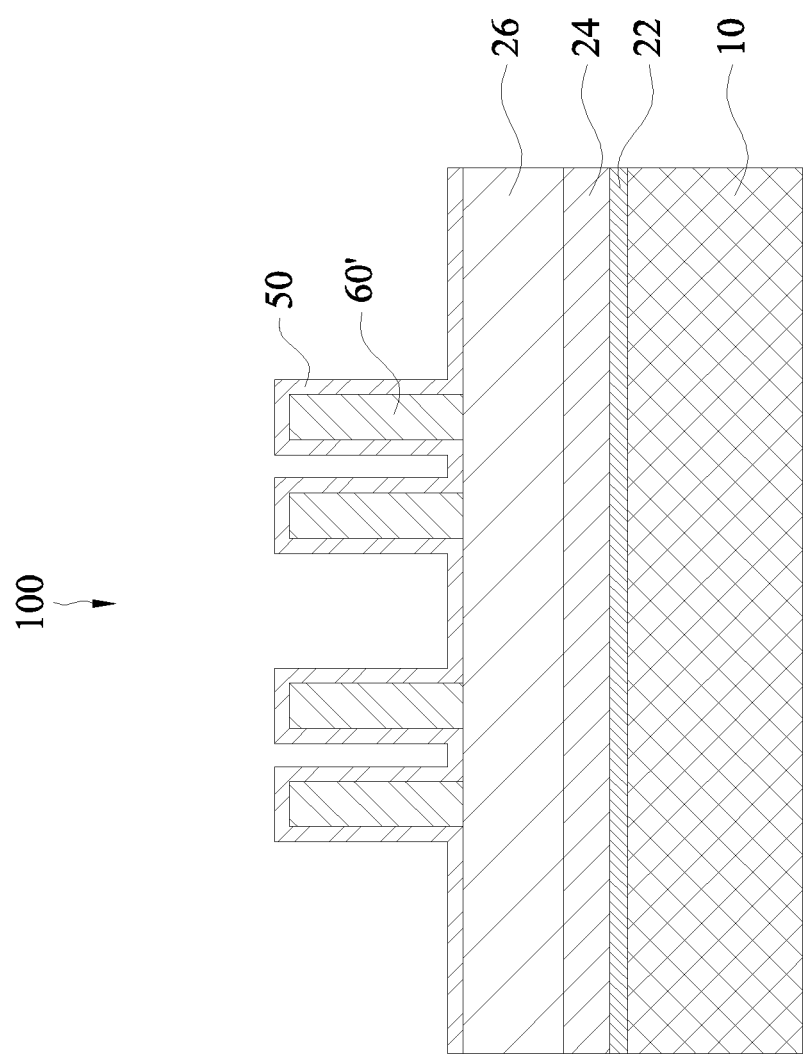

Referring to FIG. 9. Spacers B 60' with flat top surfaces formed in FIG. 8 are used as mandrels, and a Spacer A layer 50 is conformally deposited over the mandrels (e.g., Spacers B 60') and hard mask layer 26. Next, as illustrated in FIG. 10, Spacer A layer 50 formed in FIG. 9 is etched by a Spacer A plasma etching process to form Spacers A 50'. Details regarding the Spacer A layer deposition and the Spacer A plasma etching process are similar to those discussed in FIG. 3 and FIG. 4, and not repeated herein. In FIG. 10, after Spacers 50' are formed, the mandrels (e.g., Spacers B 60') are selectively etched by a mandrel plasma etch process similar to the mandrel plasma etch process discussed in FIG. 5 and details are not repeated herein.

When the desired pattern density or pitch is reached, the alternately performed Spacer A/Spacer B patterning process is stopped. For example, one may choose to stop after a Spacer A patterning process (e.g., FIG. 5 or FIG. 10) or after a Spacer B patterning process (e.g., FIG. 8 or another Spacer B patterning process performed after the step shown in FIG. 10, not shown). The mandrels (e.g., Spacers A or Spacers B) after a last spacer patterning process are used as masks to pattern the underlying hard mask layers (26, 24 and 22) and substrate 10, as illustrated in FIG. 11.

Embodiments of the above described self-aligned multiple spacer patterning process have many advantages. The new self-aligned multiple spacer patterning process significantly reduces spacer height loss and improves the effective spacer height. This allows for multiple iterations of Spacer A patterning process and Spacer B patterning process to be performed and still maintain enough mask for subsequent etching of underlying layers. Unlike existing multiple spacer patterning processes, such as self-aligned quadruple patterning process (SAQP), which require two or more different mandrel layers and complicated film schemes, the present disclosure only requires one mandrel layer (e.g., mandrel layers 30 in FIG. 1) in the film scheme. With only one mandrel layer, no transient layers between mandrel layers are needed, thus the present disclosure could avoid many problems associated with multiple mandrel layers, such as mandrel profile getting worse when transferred across multiple mandrel layers, transient layer residue and removal problem, and film interface defects. Few layers and a simpler film scheme also allows for simpler overlay control and results in less lithography overlay issues, which helps to reduce production cost and improve yields. The present disclosure can utilize proven existing lithography techniques, such as 193 nm immersion lithography, to achieve 32 nm or smaller pitch while also having a lower cost and higher throughput than the newer lithography methods such as extreme ultraviolet (EUV) lithography or the like.

FIG. 12 illustrates a flow chart for the self-aligned multiple patterning process, in accordance with various embodiments of the present disclosure. The flowchart shown in FIG. 12 is merely an example, which should not unduly limit the scope of the claims. One of ordinary skill in the art would recognize many variations, alternatives, and modifications. For example, various steps as illustrated in FIG. 12 may be added, removed, replaced, rearranged and repeated.

Referring to FIG. 12. At step 1010, a photo resist is patterned. At step 1020, the pattern of the photoresist is transferred to an underlying mandrel layer to form mandrels. At step 1030, a Spacer A patterning process is performed. The Spacer A patterning process comprises a Spacer A layer deposition process, a Spacer A plasma etch process to form Spacers A, and a mandrel plasma etch process to remove mandrels disposed between Spacers A, which processes are illustrated in FIG. 3 to FIG. 5, in accordance with some embodiments. At step 1040, using Spacers A formed in step 1030 as mandrels, a Spacer B patterning process is performed. The Spacers B patterning process comprises a Spacer B layer deposition process, a Spacer B plasma etch process to form Spacers B, a Spacer B wet cleaning process for removal of by-products of the Spacer B plasma etch process, and a wet cleaning process for mandrels (e.g., Spacers A) removal, which processes are illustrated in FIG. 6 to FIG. 8, in accordance with some embodiments. At step 1050, using spacers from a previous spacer patterning process (e.g., Spacer B patterning process or Spacer A patterning process) as mandrels, the Spacer A patterning process and the Spacer B patterning process are alternately performed multiple times, until a predetermined pattern density or pitch is reached. At step 1060, spacers from the last spacer patterning process (e.g., Spacer B patterning process or Spacer A patterning process) are used as masks to pattern the underlying layers.

An embodiment is a method of forming a semiconductor device, the method including patterning a mandrel layer disposed over a semiconductor device layer to form a mandrel, forming a first set of spacers on sidewalls of the mandrel using a first material, selectively removing the mandrel disposed between the first set of spacers. The method further includes after removing the mandrel, using the first set of spacers as a first set of mandrels, forming a second set of spacers on sidewalls of the first set of mandrels using a second material, the second material having a different etch selectivity from the etch selectivity of the first material, the second set of spacers have substantially flat top surfaces, and selectively removing the first set of mandrels disposed between the second set of spacers.

Another embodiment is a method of patterning a semiconductor device, the method including forming a plurality of hard mask layers over a semiconductor device layer, forming a mandrel layer over the plurality of hard mask layers, patterning the mandrel layer to form a first mandrel. The method further includes after forming the first mandrel, performing a first spacer patterning process, which comprises forming a first set of spacers on sidewalls of the first mandrel, the first set of spacers comprising a first material, and selectively removing the first mandrel without attacking the first set of spacers and the hard mask layer. The method further includes using one of the first set of spacer as a second mandrel, performing a second spacer patterning process, which comprises forming a second set of spacers on sidewalls of the second mandrel, the second set of spacers having substantially flat top surfaces and comprising a second material, the second material having an etch selectivity different from that of the first material, and selectively removing the second mandrel without attacking the second set of spacers and the hard mask layer.

A further embodiment is a method of patterning a semiconductor device, the method including forming one or more hard mask layers over a semiconductor device layer, patterning a mandrel layer over the one or more hard mask layers to form a first mandrel, after forming the first mandrel, iteratively performing a spacer patterning process, wherein each iteration of the spacer patterning process further comprises a first spacer patterning process followed by a second spacer patterning process, wherein the first spacer patterning process comprises conformally depositing a first spacer layer comprising a first material over the first mandrel and the one or more hard mask layers, performing a first spacer plasma etch process to form a first set of spacers on sidewalls of the first mandrel, and selectively removing the first mandrel without attacking the first set of spacers and the one or more hard mask layers; and wherein the second spacer patterning process comprises using one of the first set of spacers formed in the first spacer patterning process as a second mandrel, conformally depositing a second spacer layer comprising a second material over the second mandrel and the one or more hard mask layers, the second material having an etch selectivity different from that of the first material, performing a second spacer plasma etch process to form a second set of spacers on sidewalls of the second mandrel, the second spacer plasma etch process producing substantially flat top surfaces for the second set of spacers, selectively removing the second mandrel without attacking the second set of spacers and the one or more hard mask layer, and using one of the second set of spacers as the first mandrel for the first spacer patterning process in a next iteration.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
   patterning a mandrel layer disposed over a semiconductor device layer to form a mandrel;
   forming a first set of spacers on sidewalls of the mandrel using a first material, comprising
      conformally depositing a spacer layer comprising the first material over the mandrel and an underlying hard mask layer;
      performing a first plasma etch process to anisotropically etch the spacer layer and expose a top surface of the mandrel and the hard mask layer; and
      performing a second plasma etch process to remove residues from the first plasma etch process and control a profile of the first set of spacers;
   selectively removing the mandrel disposed between the first set of spacers;
   after removing the mandrel, using the first set of spacers as a first set of mandrels, forming a second set of spacers on sidewalls of the first set of mandrels using a second material, the second material having a different etch selectivity from the etch selectivity of the first material, and the second set of spacers having substantially flat top surfaces; and
   selectively removing the first set of mandrels disposed between the second set of spacers.

2. The method of claim 1, further comprising:
   after the selectively removing the first set of mandrels, performing multiple iterations of a spacer patterning process until a predetermined pattern density or pitch is reached, wherein each iteration of the spacer patterning process comprises
      using spacers from a previous processing step or a pervious iteration as mandrels;
      forming new spacers on sidewalls of the mandrels, wherein the new spacers are formed using the first material and the second material alternately in different iterations, wherein the first material is used in a first iteration to form the new spacers, and wherein the new spacers formed using the second material have substantially flat top surfaces; and selectively removing the mandrels disposed between the new spacers.

3. The method of claim 2, further comprising after a last iteration of the spacer patterning process, using spacers from the last iteration of the spacer patterning process as masks to pattern the semiconductor device layer.

4. The method of claim 1, wherein the first material comprises SiO, SiN, SiON, SiC, SiCN, or SiOCN.

5. The method of claim 1, wherein the second material comprises amorphous silicon, amorphous carbon, group III-V materials, or aluminum nitride.

6. The method of claim 1, wherein the forming a second set of spacers on sidewalls of the first set of mandrels using a second material comprises:

conformally depositing another spacer layer comprising the second material over the first set of mandrels and the hard mask layer; and performing a two-step plasma etch process to anisotropically etch the another spacer layer and expose a stop surface of the first set of mandrels and the hard mask layer, the two-step plasma etch process comprising a surface modification process; and a sidewall polymer fence protection process.

7. The method of claim 6, wherein the surface modification process modifies a material structure of top surfaces of the second set of spacers and forms a hardened protection layer to reduce faceting at top portions of the second set of spacers.

8. The method of claim 6, wherein by-products of the sidewall polymer fence protection process accumulates along sidewalls of the second set of spacers to reduce faceting at the top portions of the second set of spacers.

9. The method of claim 6, wherein the surface modification process is performed via a plasma etch at a pressure in a range from about 2 mTorr to about 60 mTorr, at a top power in a range from about 300 watts to about 1400 watts, with an etching bias in a range from about 30 volts to about 900 volts, at a temperature in a range from about 10° C. to about 70° C., with a plasma flow including from about 10 sccm to about 800 sccm of $H_e$, about 10 sccm to about 800 sccm of $A_r$, and about 30 sccm to about 800 sccm of $O_2$.

10. The method of claim 6, wherein the sidewall polymer fence protection process is performed via a plasma etch at a pressure in a range from about 2 mTorr to about 60 mTorr, at a top power in a range from about 300 watts to about 1000 watts, with an etching bias in a range from about 30 volts to about 900 volts, at a temperature in a range from about 20° C. to about 60° C., with a plasma flow including from about 10 sccm to about 100 sccm of $N_2$, about 10 sccm to about 600 sccm of $A_r$, about 50 sccm to about 600 sccm of $HB_r$, about 5 sccm to about 100 sccm of $O_2$, about 5 sccm to about 100 sccm of $CF_4$, about 5 sccm to about 100 sccm of $NF_3$, and about 5 sccm to about 100 sccm of $Cl_2$.

11. The method of claim 6, further comprising a wet cleaning process to remove the by-products from the two-step plasma etch process, wherein the wet cleaning process comprises wet cleaning using Sulfuric Peroxide Mixture (SPM) solution at a temperature range from about 60° C. to about 90° C., followed by wet cleaning using Ammonium hydroxide-hydrogen Peroxide Mixture (APM) solution at room temperature.

12. The method of claim 1, wherein the selectively removing the first set of mandrels is performed by a wet cleaning process, wherein the wet cleaning process comprises cleaning using a diluted HF solution, followed by cleaning using $H_3PO_4$ at a high temperature range from about 150° C. to about 170° C.

13. The method of claim 1, wherein the selectively removing the mandrel comprises removing the mandrel using a dry etch process with etch process gases including $O_2$, $Cl_2$, HBr, He, $NF_3$, or a combination thereof.

14. A method of patterning a semiconductor device, the method comprising:

forming a plurality of hard mask layers over a semiconductor device layer;

forming a mandrel layer over the plurality of hard mask layers;

patterning the mandrel layer to form a first set of mandrels;

after forming the first set of mandrels, performing a first spacer patterning process, comprising forming a first set of spacers on sidewalls of the first set of mandrels, the first set of spacers comprising a first material; and selectively removing the first set of mandrels without attacking the first set of spacers and the plurality of hard mask layers;

using the first set of spacer as a second set of mandrels, performing a second spacer patterning process, comprising forming a second set of spacers on sidewalls of the second set of mandrels, the second set of spacers having substantially flat top surfaces and comprising a second material, the second material having an etch selectivity different from that of the first material; and selectively removing the second set of mandrels without attacking the second set of spacers and the plurality of hard mask layers; and after performing the second spacer patterning process, alternately performing the first spacer patterning process and the second spacer patterning process, wherein the first spacer patterning process uses spacers from a previous second spacer patterning process as a first set of mandrels, and wherein the second spacer patterning process uses spacers from a previous first spacer patterning process as a second set of mandrels.

15. The method of claim 14, wherein when a predetermined pattern density or pitch is reached, stopping alternately performing the first spacer patterning process and the second spacer patterning process, and using spacers from a last spacer patterning process as masks to pattern the semiconductor device layer.

16. The method of claim 14, wherein the first material comprises SiO, SiN, SiON, SiC, SiCN, or SiOCN.

17. The method of claim 14, wherein the second material comprises amorphous silicon, amorphous carbon, group III-V materials, or aluminum nitride.

18. A method of patterning a semiconductor device, the method comprising:

forming one or more hard mask layers over a semiconductor device layer;

patterning a mandrel layer over the one or more hard mask layers to form a first mandrel;

after forming the first mandrel, iteratively performing a spacer pattering process, wherein each iteration of the spacer pattering process further comprises a first spacer patterning process followed by a second spacer patterning process, wherein the first spacer patterning process comprises conformally depositing a first spacer layer comprising a first material over the first mandrel and the one or more hard mask layers;

performing a first plasma etch process to form a first set of spacers on sidewalls of the first mandrel; and selectively removing the first mandrel without attacking the first set of spacers and the one or more hard mask layers; and wherein the second spacer pattering process comprises using one of the first set of spacers formed in the first spacer pattering process as a second mandrel;

conformally depositing a second spacer layer comprising a second material over the second mandrel and the one or more hard mask layers, the second material having an etch selectivity different from that of the first material;

performing a second spacer plasma etch process to form a second set of spacers on sidewalls of the second mandrel, the second spacer plasma etch process producing substantially flat top surfaces for the second set of spacers;

selectively removing the second mandrel without attacking the second set of spacers and the one or more hard mask layer; and using one of the second set of spacers as the first mandrel for the first spacer pattering process in a next iteration.

19. The method of claim 18, further comprising stopping the iteratively performed spacer pattering process when a predetermined pattern density or pitch is reached, wherein the iteratively performed spacer patterning process is stopped after the first spacer pattering process or the second spacer pattering process.

20. The method of claim 14, wherein the forming the first set of spacers comprises:

forming a spacer layer comprising the first material over the first set of mandrels and an underlying hard mask layer; and performing a first plasma etch process to etch the spacer layer and expose top surfaces of the first set of mandrels and the hard mask layer.

* * * * *